(12) United States Patent
Brigham et al.

(10) Patent No.: US 9,969,613 B2
(45) Date of Patent: May 15, 2018

(54) METHOD FOR FORMING MICRO-ELECTRO-MECHANICAL SYSTEM (MEMS) BEAM STRUCTURE

(71) Applicant: INTERNATIONAL BUSINESS MACHINES CORPORATION, Armonk, NY (US)

(72) Inventors: Michael T. Brigham, Bolton, VT (US); Christopher V. Jahnes, Upper Saddle River, NJ (US); Cameron E. Luce, Essex Junction, VT (US); Jeffrey C. Maling, Grand Isle, VT (US); William J. Murphy, North Ferrisburgh, VT (US); Anthony K. Stamper, Williston, VT (US); Eric J. White, Charlotte, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 389 days.

(21) Appl. No.: 13/861,620

(22) Filed: Apr. 12, 2013

(65) Prior Publication Data
US 2014/0308771 A1    Oct. 16, 2014

(51) Int. Cl.
   *B81C 1/00* (2006.01)
   *G06F 17/50* (2006.01)
   *B81B 3/00* (2006.01)

(52) U.S. Cl.
   CPC .......... *B81C 1/0015* (2013.01); *B81B 3/0021* (2013.01); *B81C 1/00047* (2013.01); *B81C 1/00269* (2013.01); *B81C 1/00365* (2013.01); *B81C 1/00531* (2013.01); *B81C 1/00936* (2013.01); *G06F 17/5009* (2013.01); *B81B 2203/0118* (2013.01);
   (Continued)

(58) Field of Classification Search
   CPC .................................................. B81C 1/0015
   USPC ............................................................ 438/51
   See application file for complete search history.

(56) References Cited

U.S. PATENT DOCUMENTS 6,238,581 B1    5/2001  Hawkins et al.
7,008,812 B1 *  3/2006  Carley ........................... 438/52
                        (Continued)

FOREIGN PATENT DOCUMENTS

CN       1849547       10/2006
CN       101033057     9/2007
                    (Continued)

OTHER PUBLICATIONS

Office Action dated Feb. 3, 2016 in related U.S. Appl. No. 14/837,024, 12 pages.

(Continued)

*Primary Examiner* — Brett Feeney
*Assistant Examiner* — Erik T Peterson
(74) *Attorney, Agent, or Firm* — Steven Meyers; Andrew M. Calderon; Roberts Mlotkowski Safran Cole & Calderon, P.C.

(57) ABSTRACT

Micro-Electro-Mechanical System (MEMS) structures, methods of manufacture and design structures are disclosed. The method includes forming a Micro-Electro-Mechanical System (MEMS) beam structure by venting both tungsten material and silicon material above and below the MEMS beam to form an upper cavity above the MEMS beam and a lower cavity structure below the MEMS beam.

19 Claims, 5 Drawing Sheets

(52) U.S. Cl.
CPC ... *B81B 2203/0315* (2013.01); *B81B 2207/09* (2013.01); *B81C 2201/0104* (2013.01); *B81C 2201/0107* (2013.01); *B81C 2201/0121* (2013.01); *B81C 2201/0125* (2013.01); *B81C 2201/0132* (2013.01); *B81C 2201/0176* (2013.01); *B81C 2201/0181* (2013.01); *B81C 2203/0109* (2013.01); *B81C 2203/0145* (2013.01); *B81C 2203/0714* (2013.01)

(56) References Cited

U.S. PATENT DOCUMENTS

| | | | | |
|---|---|---|---|---|
| 7,923,790 | B1* | 4/2011 | Quevy | B81C 1/00333 257/414 |
| 8,921,144 | B2* | 12/2014 | Dunbar et al. | 438/50 |
| 2004/0191946 | A1 | 9/2004 | Patel et al. | |
| 2006/0179640 | A1 | 8/2006 | Machida et al. | |
| 2007/0170540 | A1 | 7/2007 | Chung et al. | |
| 2008/0151352 | A1* | 6/2008 | Chung | G02B 26/001 359/290 |
| 2009/0075415 | A1* | 3/2009 | Nakamura | B81C 1/00333 438/51 |
| 2009/0134513 | A1 | 5/2009 | Qiu | |
| 2009/0218312 | A1 | 9/2009 | Floyd et al. | |
| 2009/0267166 | A1* | 10/2009 | Verheijden et al. | 257/415 |
| 2010/0065930 | A1* | 3/2010 | Nakatani | B81C 1/00476 257/415 |
| 2010/0311209 | A1 | 12/2010 | Huang | |
| 2011/0049649 | A1* | 3/2011 | Anderson | B81C 1/00333 257/415 |
| 2011/0314669 | A1* | 12/2011 | Stamper | B81C 1/00365 29/846 |
| 2011/0315527 | A1* | 12/2011 | Dang | B81C 1/00365 200/181 |
| 2011/0316097 | A1* | 12/2011 | Herrin et al. | 257/415 |
| 2011/0316098 | A1 | 12/2011 | Dunbar, III et al. | |
| 2011/0318861 | A1* | 12/2011 | Jahnes | B81C 1/00476 438/52 |
| 2012/0025331 | A1* | 2/2012 | Anderson | B81C 1/00182 257/415 |
| 2012/0098136 | A1* | 4/2012 | Lindgren | H01H 59/0009 257/770 |
| 2012/0133006 | A1* | 5/2012 | Hasselbach et al. | 257/418 |
| 2012/0319527 | A1* | 12/2012 | Jahnes | B81B 3/001 310/300 |

FOREIGN PATENT DOCUMENTS

| | | |
|---|---|---|
| CN | 101271826 | 9/2008 |
| CN | 102471048 A | 5/2012 |
| CN | 102906011 | 1/2013 |

OTHER PUBLICATIONS

Final Office Action dated Aug. 1, 2016 in related U.S. Appl. No. 14/837,024, 10 pages.
Office Action dated Apr. 7, 2017 in related U.S. Appl. No. 15/162,988, 10 pp.
Office Action dated Apr. 7, 2017 in related U.S. Appl. No. 15/162,994, 9 pp.
Office Action dated Apr. 7, 2017 in related U.S. Appl. No. 15/162,997, 9 pp.
Office Action dated Apr. 10, 2017 in related U.S. Appl. No. 114/837,024, 10 pp.
Final Office Action dated Sep. 11, 2017 in related U.S. Appl. No. 15/162,988, 9 pp.
Final Office Action dated Sep. 14, 2017 in related U.S. Appl. No. 15/162,994, 9 pp.
Final Office Action dated Sep. 11, 2017 in related U.S. Appl. No. 15/162,997, 9 pp.
Final Office Action dated Sep. 8, 2017 in related U.S. Appl. No. 14/837,024, 11 pp.
Notice of Allowance dated Nov. 22, 2017, in related U.S. Appl. No. 15/162,994, 8 pp.
Notice of Allowance dated Dec. 4, 2017, in related U.S. Appl. No. 15/162,997, 8 pp.
Notice of Allowance dated Jan. 22, 2018, in related U.S. Appl. No. 15/162,988, 8 pp.

\* cited by examiner

METHOD FOR FORMING MICRO-ELECTRO-MECHANICAL SYSTEM (MEMS) BEAM STRUCTURE

FIELD OF THE INVENTION

The invention relates to semiconductor structures and methods of manufacture and, more particularly, to Micro-Electro-Mechanical System (MEMS) structures, methods of manufacture and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e., resistance). MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever structure. In the cantilever structure, a cantilever arm (suspended electrode) is pulled toward a fixed electrode by application of a voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness. An alternative MEMS structure is a bridge, which has both ends fixed to the wafer.

MEMS can be manufactured in a number of ways using a number of different tools. In general, though, the methodologies and tools are used to form small structures with dimensions in the micrometer scale with switch dimensions of approximately 5 microns thick, 50 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

For example, in MEMS cantilever type switches the fixed electrodes and suspended electrode are typically manufactured using a series of conventional photolithographic, etching and deposition processes. In one example, before the suspended electrode is formed, a layer of sacrificial material, e.g., silicon, is deposited under the MEMS structure, to form a cavity, the MEMS suspended electrode is formed, and silicon is deposited over the MEMS structure to form a cavity. The cavity over the MEM is used to support the formation of a cap or lid, e.g., $SiO_2/SiN$ dome, to seal the MEMS structure. However, this poses several shortcomings.

For example, although silicon is an excellent sacrificial material, PVD silicon has poor conformality and slow throughput; whereas, CVD silicon has oxygen or other impurities which prevent venting and also can have poor adhesion. The use of silicon material can also result in undercuts, lid pinning or rubbing, as well as the need for increased contact forces.

Accordingly, there exists a need in the art to overcome the deficiencies and limitations described hereinabove.

SUMMARY

In a first aspect of the invention, a method comprises forming a Micro-Electro-Mechanical System (MEMS) beam structure by venting both tungsten material and semiconductor material at least above and below the MEMS beam to form an upper cavity structure above the MEMS beam and a lower cavity structure below the MEMS beam.

In another aspect of the invention, a method of forming a Micro-Electro-Mechanical System (MEMS) beam comprises: forming a wiring layer on a substrate; forming a first tungsten material over the substrate; forming a first silicon material over the first tungsten material; forming a MEMS beam over the first silicon material; forming a via through the MEMS beam to expose the first silicon material; forming a second silicon material above the MEMS beam and within the via to contact exposed portions of the first silicon material; forming second tungsten material on the second silicon material; forming a lid over the second tungsten material; forming at least one vent hole in the lid, exposing a portion of the at least second silicon material; venting the first and second tungsten material and the first and second silicon material to form a lower cavity and an upper cavity about the MEMS beam, respectively; and sealing the at least one vent hole.

In yet another aspect of the invention, a structure comprises a cavity structure with tungsten material extruding within the cavity and a recess formed by removal of silicon material through a venting process.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the Micro-Electro-Mechanical System (MEMS) structures, which comprises the structures of the present invention. In still further embodiments, a method in a computer-aided design system is provided for generating a functional design model of the Micro-Electro-Mechanical System (MEMS) structures. The method comprises generating a functional representation of the structural elements of the Micro-Electro-Mechanical System (MEMS) structures.

More specifically, in embodiments of the present invention, a method is provided in a computer-aided design system for generating a functional design model of a MEMS structure which is embodied on tangible readable medium and when executed on a computing device generates the following functional representations: a MEMS beam having at least one via extending therethrough; a layered structure below the MEMS beam comprising a layer of tungsten material formed below a layer of silicon material; a layered structure above the MEMS beam comprising a layer of silicon material within the at least one via in contact with the silicon material below the MEMS beam, and a tungsten material thereabove; a lid formed over the layered structure above the MEMS beam; and a lower cavity and an upper cavity, formed by venting the layered structures through at least one vent hole in the lid.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
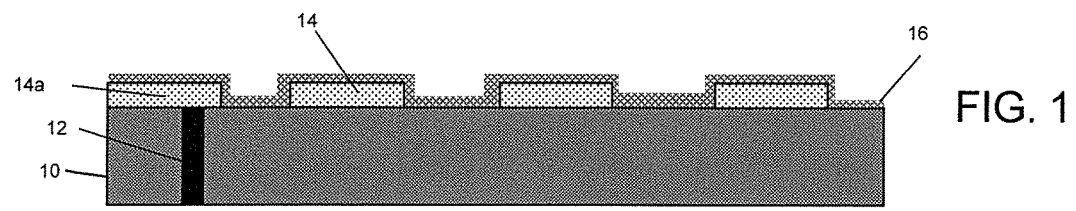
FIGS. 1-5 show structures and respective processing steps in accordance with aspects of the present invention.

The invention relates to semiconductor structures and methods of manufacture and, more particularly, to Micro-Electro-Mechanical System (MEMS) structures, methods of manufacture and design structures. More specifically, in embodiments, the present invention relates to a MEMS structure fabricated using a hybrid tungsten and silicon cavity layers where the tungsten and silicon layers are formed in separate steps. There are other semiconductor materials, such as Ge, which have properties similar to silicon which can also be used with tungsten. Accordingly, it should be understood by those of ordinary skill in the art that such other semiconductor materials can be exchanged for Si, throughout the present invention.

Advantageously, using tungsten provides for a more planar MEMS lid topology, e.g., planar MEMS cavity formation. The planar MEMS cavities will reduce fabrication issues including, for example, lithographic depth of focus variability and packaging reliability due to dielectric cracking. The combination of tungsten and silicon material can reduce or eliminate lid pinning or rubbing, as well as the need for increased contact forces.

It has been found that the use of tungsten material, alone, for the formation of cavity structures has several disadvantages. For example, it has been found that use of tungsten alone results in many issues, e.g., tungsten adhesion, high wafer bow due to very high tensile stress of CVD tungsten, and venting problems using $XeF_2$. More specifically, amongst other issues, it has been found that:

tungsten chemical vapor deposition (CVD) processes fail due to lack of adhesion on the underlying material;

CVD tungsten with a thickness of about 2.5 μm will peel at wafer edge, due to high stress and wafer bow or curvature;

tungsten cannot vent using $XeF_2$ without the aid of other materials venting at the same time;

tungsten material requires dense vent hole spacing for venting, i.e., due to a short lateral $XeF_2$ path, on the order of 3 μm, resulting in the need for closely spaced vent holes, such as every 6 μm; and chemical mechanical polishing (CMP) processes of any kind (tungsten or oxide chemistry) oxidizes tungsten surfaces making it impossible to remove during $XeF_2$ venting.

The present invention has successfully overcome the above discovered issues by developing a sacrificial cavity tungsten process which result in equivalent capacitance and reliability of the MEMS devices as compared to the use of other materials, e.g., silicon, for the sacrificial cavity. For example, in embodiments, the present invention avoids the need to CMP tungsten, and eliminates the need for dense placement of vent holes. By avoiding the CMP process on tungsten, the tungsten will not oxidize thus making it possible to vent the tungsten material with the silicon material.

In addition, the present invention can provide a silicon and tungsten based MEMS cavity with no or minimal topography or cavity residuals by using a top layer of tungsten material, or a top layer of a thinly deposited silicon material that will not form seams. The present invention also provides the following advantages:

the capability to provide planer and non-planer lids;

structures that avoid undercut of silicon and lifting of materials (e.g., improved adhesion properties to underlying materials);

non-undercut reactive ion etching (RIE) profile at cavity edge;

a layout designed to provide continual presence of silicon during tungsten venting, to ensure that tungsten material can be properly vented;

minimizing or reducing lid pinning by a lateral movement of the MEMS beam during processing;

the elimination of unacceptable wafer bowing; and/or the elimination of peeling for tungsten depositions of about 3 μm and less by providing a barrier layer of tungsten formed using a plasma vapor deposition (PVD) process.

In embodiments, the processes of the present invention include different combinations of a layered sacrificial cavity structure comprising silicon and tungsten. In more specific examples, the present invention relates to a MEMS structure and method of forming a MEMS cavity (e.g., upper cavity) with a first layer of silicon, a layer of tungsten formed upon the first layer of silicon, and, in embodiments, a second layer of silicon formed upon the layer of tungsten. These materials can then be removed by a venting process, e.g., venting the first layer and second layer of silicon and the layer of tungsten through vent holes.

In embodiments, the layer of tungsten is vented continually while the silicon is vented, thus ensuring that no residual tungsten (or an insignificant amount of tungsten) is left within the formed cavity structure. The removal of the silicon layers and the tungsten layer(s) may occur in the same process step, e.g., $XeF_2$ etching process. In embodiments, the tungsten material advantageously provides a gap fill for the silicon, as well as the other advantages described herein. The silicon material, on the other hand, provides the bulk of material filling in the cavity structure. It should be understood that although the present invention is discussed with reference to CVD tungsten processes, other materials using CVD or ALD deposition processes are also contemplated by the present invention, taking into consideration that such materials should produce volatile fluorine when venting with, for example, $XeF_2$ etchant chemistry.

FIG. 1 shows a structure and related processing steps in accordance with aspects of the invention. The structure includes, for example, a substrate 10. The substrate 10, in embodiments, can be any layer of a device. In embodiments, the substrate 10 is an oxide or other insulator material coated silicon wafer or any substrate known to those of skill in the art. As should be known to those of skill in the art, the substrate 10 can be implemented in either an SOI wafer or BULK implementation, or could be an insulating substrate such as sapphire or silica glass. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

An interconnect 12 is provided within the substrate 10. The interconnect 12 can be, for example, a tungsten or copper stud formed in a conventionally formed via. For example, the interconnect 12 can be formed using any conventional lithographic, etching and deposition processes, known to those of skill in the art for forming studs.

Still referring to FIG. 1, a wiring layer is formed on the substrate 10 to form multiple wires 14 using conventional deposition and patterning processes. For example, a wiring layer can be deposited on the substrate to a depth of about 0.25 microns; although other dimensions are contemplated by the present invention. Thereafter, the wiring layer is patterned to form the wires 14. At least one of the wires 14a is in contact (direct electrical contact) with the interconnect 12. In embodiments, the wires 14 can be formed from aluminum; although other wiring materials are also contemplated by the present invention. For example, the wires 14 can be a refractory metal such as Ti, TiN, TaN, Ta, and W, or AlCu, AlCuSi, or Cu, CuMn, amongst other wiring materials. In embodiments, the wires 14 could be cladded with Ti and capped with an antireflective layer TiN, e.g. Ti/Al/Ti/TiN; or cladded in Ta or TaN. An optional insulator material 16 is formed on the multiple wires 14 and exposed portions of the substrate 10. In embodiments, the insulator material 16 is an oxide deposited to about 50 nm; although other dimensions are also contemplated by the present invention.

Figure 2:
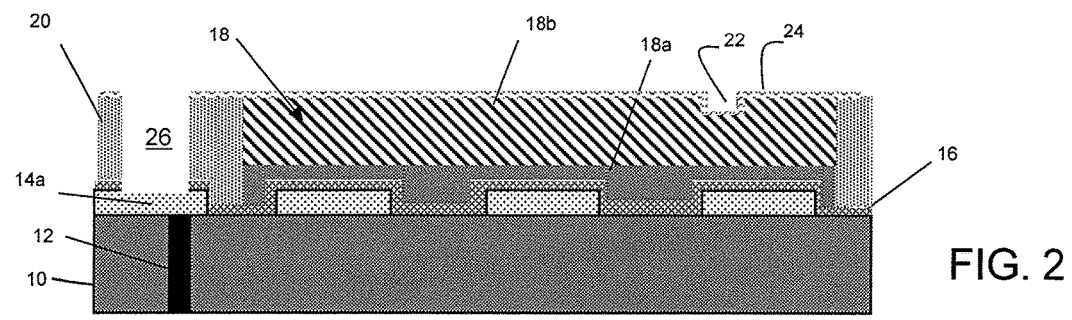

In FIG. 2, a sacrificial material 18 can be deposited on the insulator material, which is used to form a lower cavity structure. In embodiments, the sacrificial material 18 is a combination of tungsten material 18a and silicon material 18b, which is patterned using conventional lithographic, reactive ion etching (RIE), and CMP steps. In embodiments, the sacrificial material 18 can be deposited to a height of about 0.1 to 10 µm which is determined by the MEMS gap requirement.

In more specific embodiments, the sacrificial material 18 is a combination of silicon and tungsten which can subsequently be selectively removed using, for example $XeF_2$ gas, to the insulator material 16 or the wires 14 (if the insulator material 16 is absent). In embodiments, the sacrificial material 18 comprises a lower tungsten material 18a and an upper silicon material 18b. In embodiments, the tungsten material 18a can be deposited using a combination of a physical vapor deposition (PVD) process and a chemical vapor deposition (CVD) process to a depth of about 0.3 µm; although other depths are contemplated by the present invention. The upper silicon material 18b can be deposited using a CVD process to a depth of about 2 µm; although other depths are contemplated by the present invention. In embodiments, the silicon material 18b can undergo a chemical mechanical polishing (CMP) with a cleaning.

The lower tungsten material 18a and upper silicon material 18b can be patterned using conventional lithographic and reactive ion etching (RIE) steps, as is known to those of skill in the art. Also, as in any of the embodiments, it should be understood by those of skill in the art that there is no oxidation (oxide) material at the interface between tungsten material and the silicon material, at any level of the structure, e.g., tungsten material 18a and the silicon material 18b. An optional tungsten oxide removal clean, such as HF or CrP acid, could be employed, using a vapor or wet chemical process, to remove the tungsten oxide prior to the silicon deposition. This tungsten oxide removal process can be performed either ex-situ or in-situ. An in-situ clean would be performed between the last tungsten and the first silicon deposition without breaking vacuum in the deposition tool.

Referring still to FIG. 2, an insulator material (e.g., oxide) 20 is deposited on the sacrificial material 18. The deposition can be, for example, a conventional conformal deposition process, e.g., chemical vapor deposition (CVD), depositing the insulator material 20 to a depth of about 2.3 µm to about 3.3 µm; although other depths are also contemplated by the present invention. The insulator material 20 can be polished, e.g., planarized using a CMP process, to achieve a planar surface with the sacrificial material 18.

In embodiments, the insulator material 20 can undergo a reverse etch (reverse damascene process). More specifically, a resist can be deposited on the insulator material 20, which is patterned to form an opening, with the resist edges overlapping with edges of the underlying sacrificial material 18. That is, the resist will slightly mask the underlying sacrificial material 18, resulting in a reverse image of the patterned sacrificial material 18. The insulator material 20 is then planarized, e.g., to be planar or nearly planar (e.g., flat or planar surface) with the underlying sacrificial material 18. That is, in embodiments, the insulator material 20 can be etched to the underlying sacrificial material 18. This planarization process will also planarize the underlying sacrificial material 18. The planarization process can be, for example, a CMP process.

Still referring to FIG. 2, in an optional embodiment, one or more trenches 22 can be formed in the sacrificial material 18, over wirings 14. In embodiments, the trenches 22 can be of constant or varying depths used to form an array of bumpers for the MEMS beam, sized and shaped according to the location on the MEMS beam, e.g., the depth of the trenches may increase towards an end of a MEMS cantilever beam or, alternatively, a reduced area of the beam structure which is initially pulled-in during actuation (whether a cantilever beam or a bridge beam). In embodiments, the array of trenches are structured so as to provide a predetermined amount of physical spacing, such as 50 nm, between the MEMS beam and an actuator electrode when a voltage is present on the actuator electrode; or they are positioned so that the grounded and dc biased actuators never come into physical contact. The array of bumpers (formed by the trenches) can also prevent MEMS beam stiction.

In embodiments, deeper trenches can be formed at an end or mid section (e.g., initial pull-in of the MEMS beam), and can be, e.g., formed to a depth of about 0.3 µm; although other dimensions are contemplated by the invention depending on the design parameters and, more particularly, the height of the sacrificial material 18. For example, the depth can range from about 1000 Å to 5000 Å. A capacitor oxide deposition is performed on the exposed surfaces, e.g., on the sacrificial material 18, insulator material 20 and in the trench 22, to form a liner 24. A via 26 can be formed in the insulator material 20 to the underlying wire 14a, using conventional lithographic and etching processes.

Figure 3:
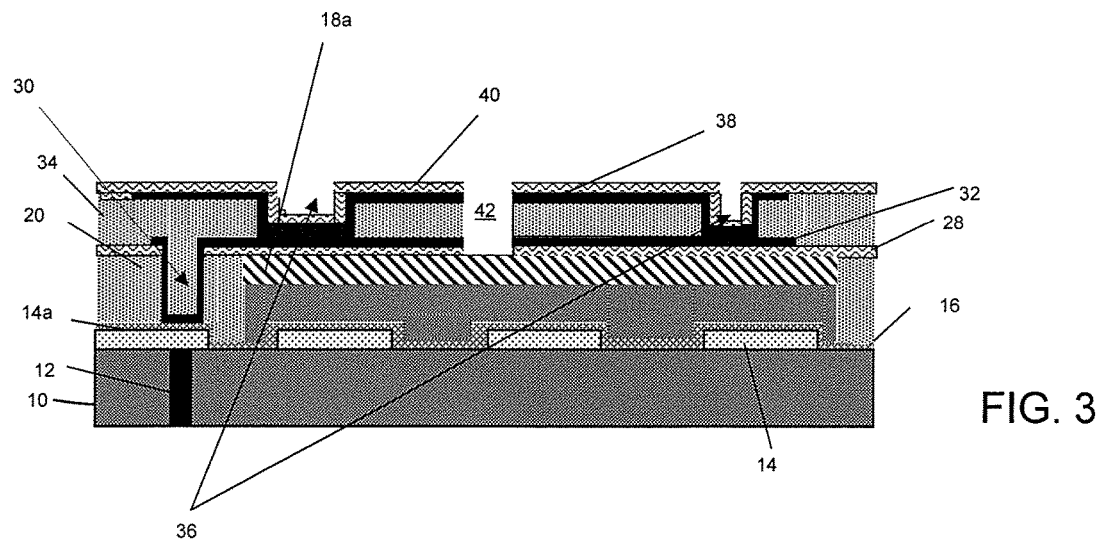

In FIG. 3, a dielectric material 28 is deposited on the sacrificial material 18, e.g., silicon material 18b, and insulator layer 20. In embodiments, the dielectric material 28 forms part or all of a MEMS capacitor dielectric. The dielectric material 28, e.g., oxide, can be deposited to a height of about 80 nm; although other dimensions are contemplated by the present invention. A via 30 can be formed in the insulator layers 20 and 28 to the underlying wire 14a. The via 30 can be formed using conventional lithographic, etching, and cleaning processes, as known in the art. In embodiments, the via 30 should be used outside of the cavity area, because the oxide etch used to fabricate it would be blocked by the layer 18 if it was placed inside the silicon cavity.

A subsequent metal layer 32 is formed and patterned on the insulator material 28 and within the via 30. The metal layer 32 will contact with the wire (electrode) 14a. In embodiments, the metal layer 32 is used to form the MEMS beam lower electrode. In embodiments, the metal layer 32 can be TiN, TiN or W, Ru, Pt, Ir, amongst other materials. The thicknesses of this and other electrodes and/or wires can vary depending on the specific design parameters. For example, Ti/AlCu/Ti/TiN layers could be used with 10 nm, 5000 nm, 10 nm, and 32 nm thickness, respectively, which would form $TiAl_3$ under and over the AlCu after 400° C. annealing. Alternatively, the metal layer 32 could be formed from a noble metal, such as Au; or a refractory metal, such as W or Ta; or without a Ti—AlCu interface, e.g., Ti/TiN/AlCu/TiN.

Still referring to FIG. 3, an insulator material 34 is conformally deposited over the metal layer 32. In embodiments, the insulator material 34 is a deposited oxide using any of the methods discussed herein. In embodiments, the insulator material 34 is deposited to a height of about 0.5 µm to 5 µm, depending on the beam spring constant and oxide to metal thickness ratio requirements. In embodiments, vias 36 are formed in the insulator material 34, to expose portions of the underlying metal layer 32.

An upper electrode (metal layer) 38 is formed and patterned over the insulator layer 34, and also deposited within the vias 36 to contact the lower electrode (metal layer) 32. In embodiments, the upper electrode 38 is formed from the same materials as the lower electrode 32. For example, in one exemplary embodiment, the electrodes 32 and 38 are composed of Ti/AlCu/Ti/TiN. The metal volume of the electrodes 32 and 38 should preferably be the same or substantially the same in order to balance the overall volume and stress of the device, and hence not place undue stresses on the beams of the MEMS structures, as discussed in U.S. application Ser. No. 12/974,854, the contents of which are incorporated by reference herein in its entirety.

Still referring to FIG. 3, an optional insulator material 40 is deposited on the upper electrode 38 and exposed portions of the insulator material 34. In embodiments, the insulator material 40 is deposited to a thickness of about 80 nm; although other dimensions are also contemplated by the present invention. To balance the MEMS beam, the insulator material 40 over the MEMS beam should be substantially the same thickness as the insulator material 28 under the MEMS beam. A cavity via 42 is formed through the insulator materials 28, 34 and 40 and electrodes 32 and 38 to the underlying silicon layer 18a, by patterning and etching through the materials using known lithography and etching processes. In embodiments, any unwanted oxide, such as a native oxide which is formed by exposing the layer 18b to air, can be cleaned using, for example, an HF acid, prior to the subsequent material deposition.

Figure 4:
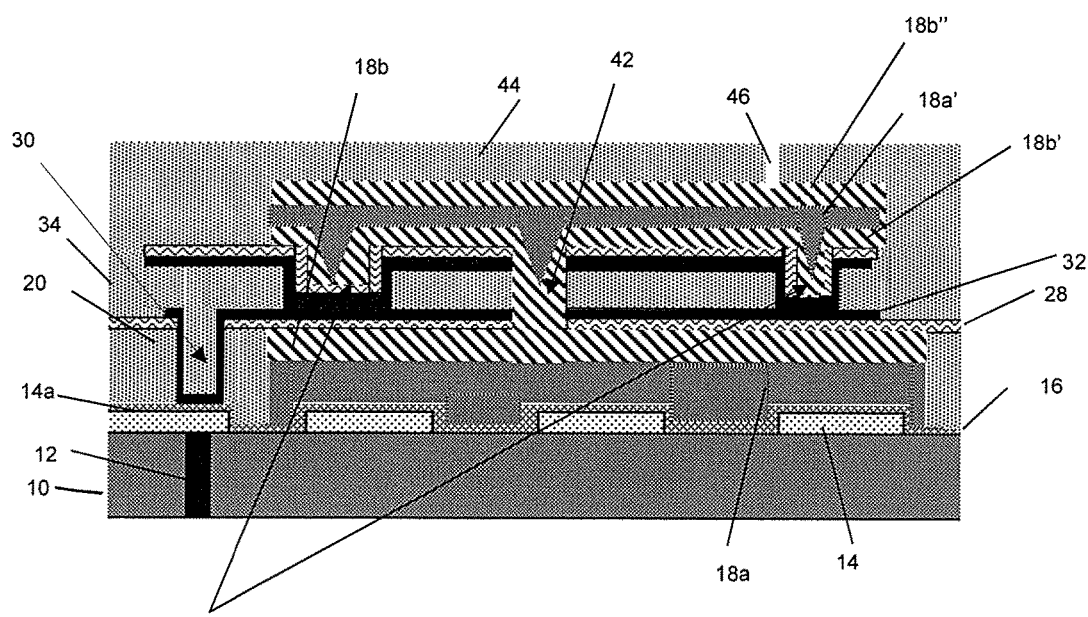

In FIG. 4, an upper cavity of the MEMS device is formed in accordance with aspects of the present invention. Specifically, a silicon material 18b' is deposited on the insulator material 40 and within the via 42, contacting the silicon material 18b. In embodiments, the silicon material 18b' is deposited to a depth of about 3 µm; although other dimensions are contemplated by the present invention. In embodiments, the silicon deposition process is a conformal process, leaving slight recess. The silicon material 18b' can undergo a cleaning process using, e.g., dilute HF.

Tungsten material 18a' is deposited on the silicon material 18b'. In embodiments, the tungsten material 18a' can be deposited to a thickness of about 70 nm using a PVD process, followed by a CVD process at about 395° C., for example. In embodiments, the CVD process will deposit tungsten to a thickness of about 0.45 µm; although other dimensions are contemplated by the present invention. Also, as shown in FIG. 4, the tungsten will fill the recesses (seams), formed by the conformal deposition process of the silicon material 18b'. An optional surface clean using, for example, HF, could be performed between the PVD and CVD tungsten depositions to remove tungsten oxide from the surface of the PVD tungsten.

A layer of silicon material 18b" is deposited on the tungsten material 18a' using, for example, a PVD process. In embodiments, the PVD process will deposit the silicon material 18b" to a thickness of about 2 µm; although other thicknesses are also contemplated by the present invention. In embodiments, the silicon material 18b" can be planarized (e.g., using CMP) and cleaned to remove any CMP slurry residue (e.g., DHF process). The tungsten material 18a' should not be exposed to the optional silicon CMP process to avoid oxidizing the tungsten surface. The silicon material 18b' and 18b" should preferably be deposited to such a thickness that silicon material remains during the venting of any tungsten material, to ensure that the tungsten material is completely or substantially completely removed during cavity formation. Also, as in any of the embodiments, the tungsten material 18a' is free of oxide at the interface between tungsten material and the silicon material, e.g., silicon material 18b' and 18b", at any level of the structure.

As further shown in FIG. 4, the layers 18a' 18b' and 18b" can be patterned using conventional lithography and etching processes, known to those of skill in the art. An insulator (oxide) material 44 can be deposited on the silicon material 18b" and any exposed insulator material 34, to form a lid. As in any of the embodiments, there can be a 10× reduction in or elimination of lid topography using tungsten fill processes of the present invention. In embodiments, the insulator material 44 can be deposited to a thickness of about 5 µm or more, and can be deposited using any conventional CVD process. The insulator material 44 can be planarized, partially planarized or left unplanarized.

In embodiments, a vent hole 46 is patterned and opened in the lid 44, exposing a portion of the underlying silicon material 18b" and, in embodiments, the tungsten material 18a'. In embodiments, the silicon material 18b" should be exposed for venting, regardless of whether the vent hole 46 exposes tungsten material 18a'. It should be understood that more than one vent hole 46 can be formed in the lid 44. The vent hole 46 can be formed using conventional lithographic and etching processes known to those of skill in the art. The width and height of the vent hole 46 determines the amount of material that should be deposited after venting to pinch off the vent hole. In general, the amount of material that should be deposited to pinch off the vent hole 46 decreases as the vent hole width decreases; and as the vent hole aspect ratio, which is the ratio of the vent hole height to width, increases. In embodiments, a 3 μm thick pre-venting lid would have a 1 μm vent hole diameter and the vent hole would be circular, octagonal, or square. The vent holes 46 can be formed at several locations, to portions (expose portions) of the silicon material 18b". For example, the vent holes 46 can be spaced apart more than 6 μm.

Figure 5:
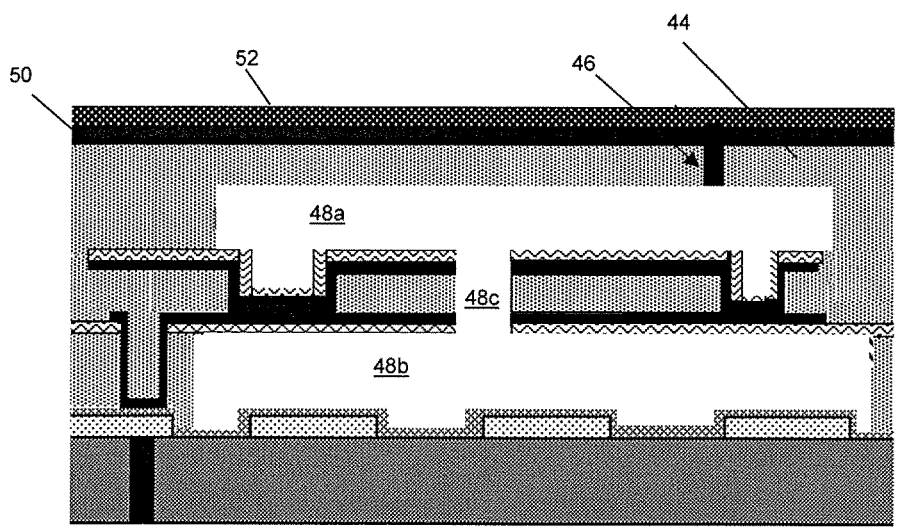

In FIG. 5, the sacrificial layers 18a, 18b, 18b' 18b" and 18a' are vented or stripped by way of the vent hole(s) 46. In embodiments, the structure, and in particular, the exposed underlying sacrificial layer 18b" can be cleaned with an HF solution prior to venting to remove the native oxide. In embodiments, the stripping (e.g., venting) can be performed using a XeF$_2$ etchant chemistry through the vent hole(s) 46, where the tungsten material is vented at the same time as the silicon material. The etching will strip all of the material (silicon and tungsten) forming an upper cavity or chamber 48a and a lower cavity or chamber 48b and a connecting via 48c, and is selective to many other materials, including SiO$_2$. In embodiments, all or substantially all of the tungsten material is removed or vented, prior to the silicon material.

As further shown in FIG. 5, the vent hole 46 can be sealed with a material 50, such as a dielectric or metal. Optional layer 52 is deposited to provide a hermetic seal. The layers 50 and 52 could be, for example, a 5 micron PECVD SiO$_2$ film and a 500 nm PECVD silicon nitride film or other films known to provide a hermetic seal over material 50.

Figure 6:
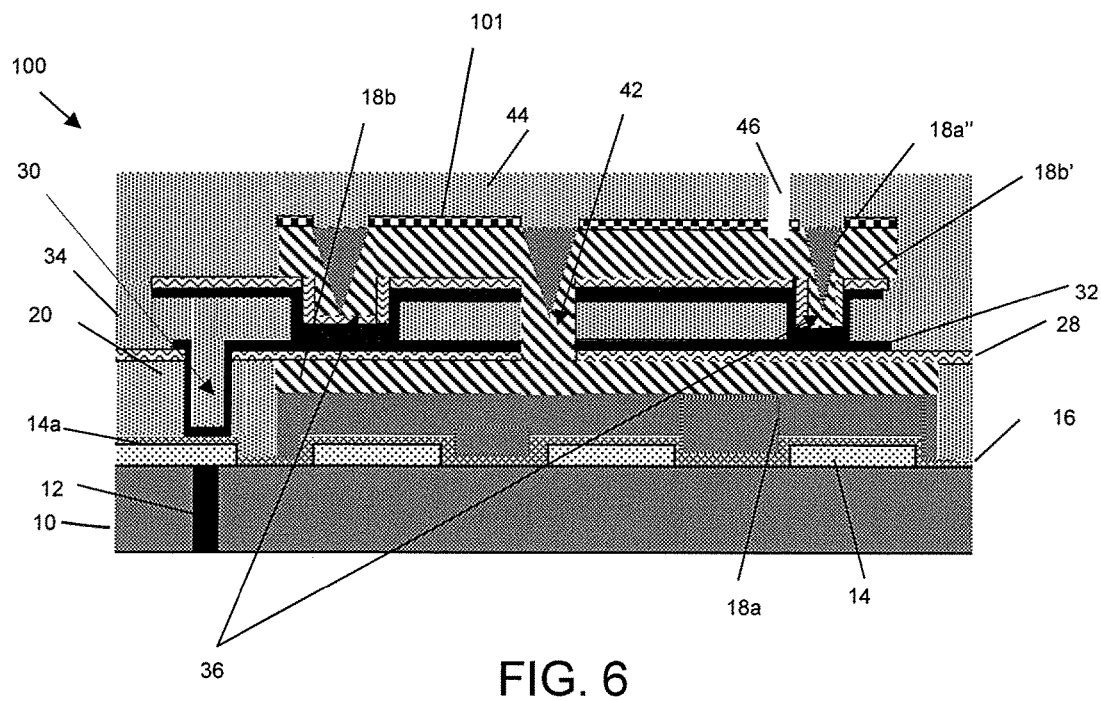
FIG. 6 shows a structure and respective processing steps in accordance with additional aspects of the present invention.

FIG. 6 shows an alternate structure and respective processing steps in accordance with aspects of the present invention. In particular, in the embodiment shown in FIG. 6, the structure 100 includes tungsten material 18a" in the recesses (seams) formed by the deposition processes of the silicon material 18b'. In embodiments, the silicon material 18b' is deposited to a depth of about 2.8 μm, using conventional conformal deposition processes, e.g., CVD. The silicon material 18b' is then optionally planarized to reduce subsequent tungsten depth. The planarization process can be, for example, a CMP, reducing the silicon material 18b' by about 0.7 μm; although other dimensions are also contemplated by the present invention depending on the dimension of the upper cavity. The silicon material 18b' can undergo a cleaning, e.g., brush cleaning, and a HF or other acid cleaning steps to remove residual CMP slurry and native oxide.

Dielectric layer 101 is deposited and patterned such that only the openings over the cavity vias 42 are exposed and the dielectric layer (e.g., oxide based material) 101 is subsequently etched and the patterning resist is removed as is known in the art. Tungsten material 18a" can be selectively deposited within the recesses (seams) using a low stress CVD tungsten deposition. In embodiments, the tungsten material 18a" can be deposited to a thickness of about 2 μm using the low stress CVD tungsten deposition; although other dimensions are also contemplated by the present invention depending on the dimension of the upper cavity. An optional layer of PVD tungsten, e.g., 70 nm, can be deposited prior to the deposition of the dielectric layer 101, to aid the selective CVD tungsten deposition process.

As further shown in FIG. 6, the layer 18b' can be patterned using conventional lithography and etching processes, known to those of skill in the art. An insulator (oxide) material 44 can be deposited on the silicon material 18b" and any exposed insulator material 34, to form a lid. The insulator material 44 can be planarized, partially planarized or left unplanarized. In embodiments, the insulator material 44 can be deposited to a thickness of about 5 μm or more, and can be deposited using any conventional CVD process. A vent hole 46 is patterned and opened in the lid 44, exposing a portion of the underlying silicon material 18b'. As in any of the embodiments, more than one vent hole 46 can be formed in the lid 44. The vent hole 46 may be circular or nearly circular or other shapes and sizes as already described herein.

The processes then continue by venting the sacrificial layers 18a, 18b, 18b', and 18a" by way of the vent hole 46. In embodiments, the structure, and in particular, the exposed underlying layer 18b'can be cleaned with an HF solution prior to venting to remove the native oxide. In embodiments, the stripping (e.g., venting) can be performed using a XeF$_2$ etchant chemistry through the vent hole 46, where the tungsten material is vented at the same time as the silicon material. The etching will strip all of the material (silicon and tungsten) forming an upper cavity or chamber 48a and a lower cavity or chamber 48b and a connecting via 48c, and is selective to many other materials, including SiO$_2$. In embodiments, all or substantially all of the tungsten material is removed or vented, prior to the silicon material. As described above, the vent hole 46 can be sealed with a material 50 and 52, resulting in the structure of FIG. 5.

Figure 7:
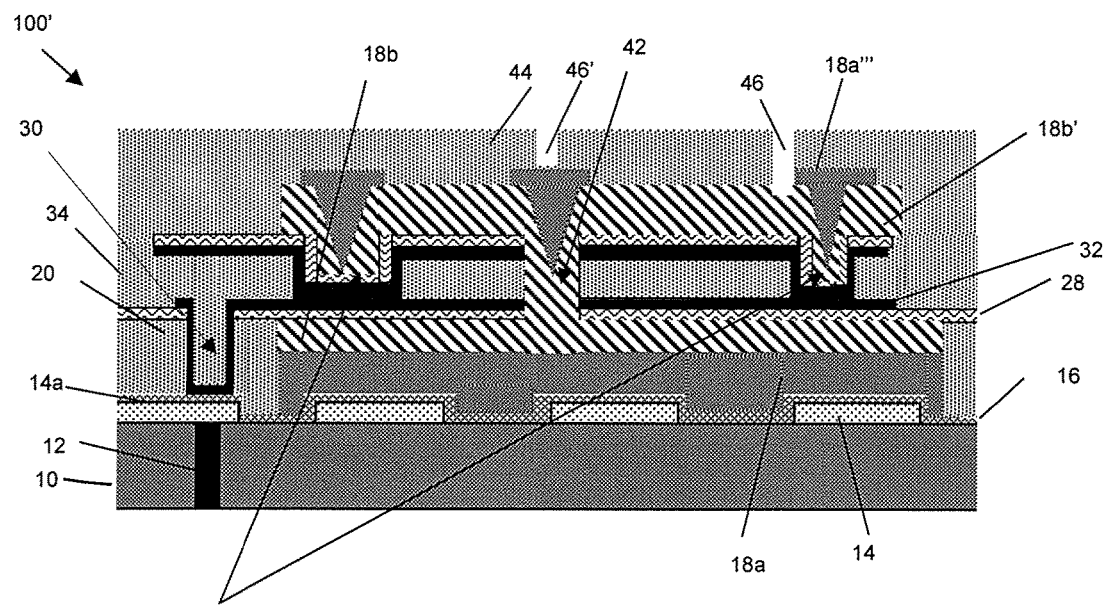
FIG. 7 shows a structure and respective processing steps in accordance with additional aspects of the present invention.

FIG. 7 shows an alternate structure and respective processing steps in accordance with aspects of the present invention. In particular, in the embodiment shown in FIG. 7, the structure 100' includes deposition of tungsten material 18a''' in the recesses (seams) and over silicon material 18b'. In embodiments, the silicon material 18b' is deposited within the vias 36 and 42, using conventional conformal deposition processes, e.g., PVD, and then cleaned, as already described herein. Tungsten material 18a''' is deposited on the silicon material 18b' using a PVD tungsten process, followed by a CVD tungsten process. In embodiments, the tungsten can be deposited to a thickness of about 1.5 μm; although other dimensions are also contemplated by the present invention depending on the dimension of the upper cavity. The tungsten material 18''' can then be patterned and etched, leaving tungsten over the cavity via 42.

As further shown in FIG. 7, the insulator (oxide) material 44 can be deposited on the tungsten material 18a''' and any exposed insulator material 34 and silicon material 18b', to form a lid as already described herein. For example, in embodiments, the insulator material 44 can be deposited to a thickness of about 5 μm or more, and can be deposited using any conventional CVD process. A vent hole 46 is patterned and opened in the lid 44, exposing a portion of the underlying silicon material 18b'. In embodiments, another vent hole 46' is patterned and opened in the lid 44, exposing a portion of the underlying tungsten material 18a'''. In this way, both the silicon material 18b' and the tungsten material 18a' are exposed for venting. As in any of the embodiments, more than one vent hole 46 (46') can be formed in the lid 44.

The processes then continue by venting the sacrificial layers 18a, 18b, 18b', and 18a''' by way of the vent holes 46, 46'. In embodiments, the structure, and in particular, the exposed underlying sacrificial layer 18b'can be cleaned with an HF solution prior to venting to remove the native oxide. In embodiments, the stripping (e.g., venting) can be performed using a XeF$_2$ etchant chemistry through the vent holes 46, 46', where the tungsten material is vented at the same time as the silicon material. The etching will strip all of the material (silicon and tungsten) forming an upper cavity or chamber 48a and a lower cavity or chamber 48b and a connecting via 48c, and is selective to many other materials, including SiO$_2$, as described with reference to FIG. 5. In embodiments, all or substantially all of the tungsten material is removed or vented, prior to the silicon material. As described above, the vent hole 46 can be sealed with a material 50 and 52, as shown in FIG. 5.

Figure 8:
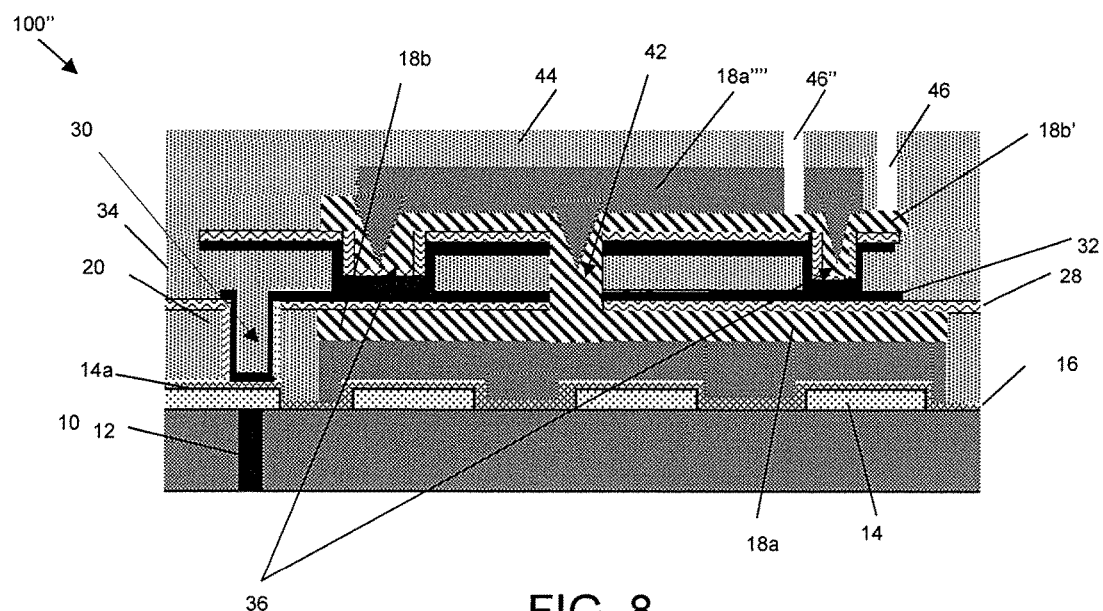
FIG. 8 shows a structure and respective processing steps in accordance with additional aspects of the present invention.

FIG. 8 shows an alternate structure and respective processing steps in accordance with aspects of the present invention. In particular, in the embodiment shown in FIG. 8, the structure 100" includes deposition of tungsten material 18a"" in the recesses (seams) and over silicon material 18b'. In embodiments, the silicon material 18b' is deposited within the vias 36 and 42, using conventional conformal deposition processes, e.g., CVD, and subjected to a planarization and cleaning processes as already described herein, e.g., brush cleaning and a HF or acid clean. Tungsten material 18a"" is deposited on the silicon material 18b' using a PVD tungsten process, followed by a CVD tungsten process. In embodiments, the tungsten can be deposited to a thickness of about 2.5 μm; although other dimensions are also contemplated by the present invention depending on the dimension of the upper cavity. The silicon material can undergo a CMP process to remove material from the surface, e.g., to remove any alumina. The surface of the materials, e.g., silicon material 18b' and tungsten material 18a"" can undergo a HF or acidic clean, with optional cleans.

As further shown in FIG. 8, the underlying silicon material 18b' can optionally extend beyond at least one edge of the tungsten material 18a"". This may occur due to a selective deposition process, or a conventional patterning process. In any scenario, the insulator (oxide) material 44 can be deposited on the tungsten material 18a"" and any exposed insulator material 34 and silicon material 18b', to form a lid, as already described herein. For example, the insulator layer 44 can be deposited to a thickness of about 5 μm or more, and can be deposited using any conventional CVD process. A vent hole 46 is patterned and opened in the lid 44, exposing a portion of the underlying silicon material 18b'. In additional or alternative embodiments, a vent hole 46" can be opened in the lid 44 and through the tungsten material 18a"", to the underlying silicon material 18b'. In this alternative embodiment, the underlying silicon material 18b' need not extend beyond edges of the tungsten material 18a"". In any of the embodiments, the silicon material 18b' should be exposed for venting, regardless of whether the vent holes 46, 46" expose tungsten material 18a"". As in any of the embodiments, more than one vent hole can be formed in the lid 44. The vent holes 46, 46" may be circular or nearly circular or other shapes and sizes as described herein.

The processes then continue by venting the sacrificial layers 18a, 18b, 18b', and 18a"" by way of the vent holes 46, 46". In embodiments, the structure, and in particular, the exposed underlying sacrificial layer 18b' can be cleaned with an HF solution prior to venting to remove the native oxide. In embodiments, the stripping (e.g., venting) can be performed using a XeF$_2$ etchant chemistry through the vent holes 46, 46", where the tungsten material is vented at the same time as venting of the silicon material. The etching will strip all of the material (silicon and tungsten) forming an upper cavity or chamber 48a and a lower cavity or chamber 48b and a connecting via 48c, and is selective to many other materials, including SiO$_2$, as shown and described with reference to FIG. 5. In embodiments, all or substantially all of the tungsten material is removed or vented, prior to the all of silicon material being removed. As described above, the vent holes can be sealed with a material 50 and 52, as shown and described with reference to FIG. 5. The combined hybrid silicon and tungsten cavity processes described above can be used to form the cavity under, over, or both under and over the MEMS beam.

Figures 9A, 9B, 9C:
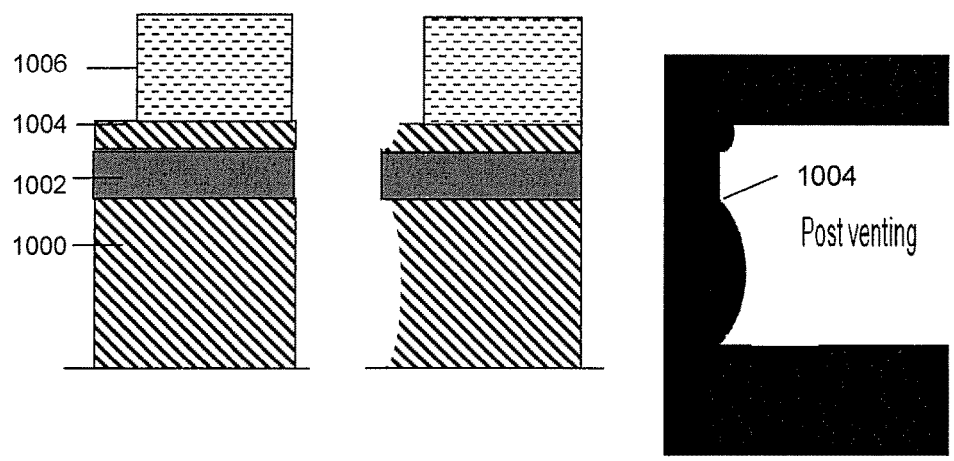
FIG. 9a-9c show structures in accordance with any of the aspects of the present invention.

FIGS. 9a-9c show structures in accordance with any of the aspects of the present invention. More specifically, FIG. 9a shows the lower silicon 1000, middle tungsten 1002, upper silicon 1004, and photoresist 1006 layers. Due to etch selectivity differences during a SF$_6$-based reactive ion etch (RIE) process, the silicon layers 1000 and 1002 are undercut much more than the tungsten layer 1004 during the post cavity patterning RIE process. This undercut difference is shown in FIG. 9b. FIG. 9c shows a cavity 200 formed by venting tungsten and silicon materials, e.g., Si, W and Si, which exhibited the RIE undercut difference shown in FIG. 9b. As should be understood by those of skill in the art, the cavity can be an upper cavity or lower cavity of a MEMS beam structure. As shown in FIG. 9c, the venting of the silicon material can form a recess or undercut 210 with respect to tungsten material 1002, after venting.

It should be understood by those of skill in the art that the tungsten material of any of the embodiments is not subjected to a CMP process. Accordingly, oxide will not form on the tungsten material above and/or below the MEMS beam. Also, in any of the embodiments, the silicon material can be subjected to a CMP process. For this reason, any material formed on the silicon material, e.g., lid material (insulator 44) can have a planar surface. Also, as should be understood by those of skill in the art, in any of the embodiments described herein, any subsequently formed layer on an immediately formed previously layer would be in direct contact with one another.

Figure 10:
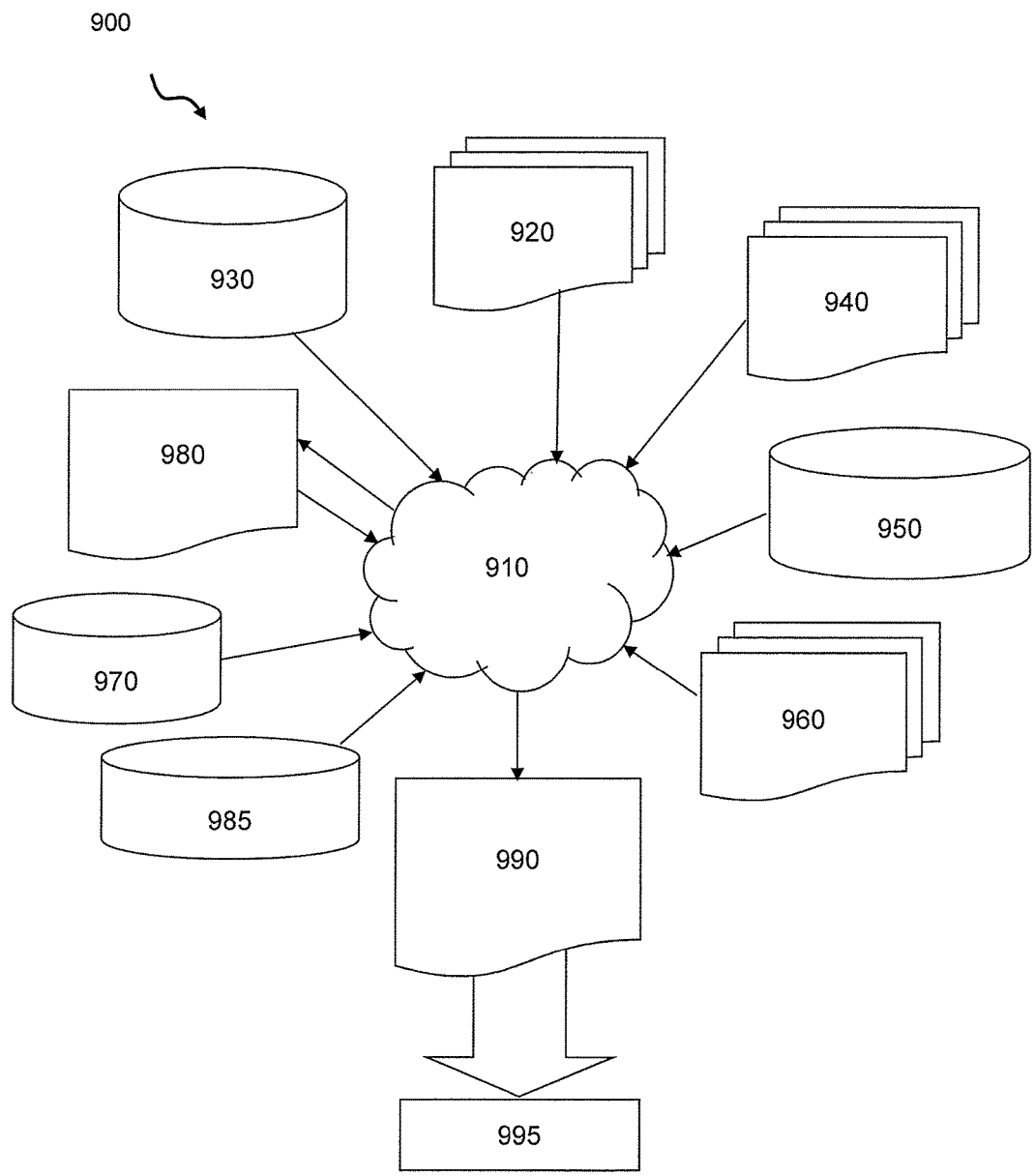
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9c. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9c. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9c to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9c. In one embodiment, design structure 990 may comprise a compiled, executable HDL simulation model that functionally simulates the devices shown in FIGS. 1-9c.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9c. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising forming a Micro-Electro-Mechanical System (MEMS) beam structure by forming tungsten material and semiconductor material on a substrate, forming the MEMS beam structure above the tungsten material and the semiconductor material, forming tungsten material and semiconductor material above the MEMS beam structure, forming a lid over the tungsten material and the semiconductor material formed above the MEMS beam structure, and by venting, using an etchant, both the tungsten material and the semiconductor material above the MEMS beam structure and by venting, by performing an etching process using an $XeF_2$ etchant, both the tungsten material and the semiconductor material below the MEMS beam structure to form an upper cavity structure above the MEMS beam structure and below the lid and a lower cavity structure below the MEMS beam structure and above the substrate, wherein the MEMS beam structure comprises a cantilevered beam structure.

2. The method of claim 1, wherein the venting and film thicknesses are controlled to ensure that all or substantially all of the tungsten material is removed above the MEMS beam structure, prior to the removal of the semiconductor material above the MEMS beam structure.

3. The method of claim 1, wherein the semiconductor material is one of silicon material and germanium material.

4. The method of claim 3, wherein the semiconductor material is silicon material, and wherein the tungsten material and silicon material below the MEMS beam structure comprises forming the tungsten material on a substrate and forming the silicon material over the tungsten material.

5. The method of claim 4, wherein the tungsten material and silicon material above the MEMS beam structure comprises forming the silicon material within a via in contact with the silicon material below the MEMS beam structure and forming the tungsten material over the silicon material.

6. The method of claim 5, wherein the venting comprises forming a vent hole in the lid to expose at least the silicon material above the MEMS beam structure.

7. The method of claim 6, wherein the tungsten material at least one of above and below the MEMS beam structure is formed by a physical vapor deposition process followed by a chemical vapor deposition process.

8. The method of claim 6, further comprising forming an additional silicon material on the tungsten material above the MEMS beam structure.

9. The method of claim 8, further comprising:
planarizing the additional silicon material;
forming the lid over the planarized additional silicon material;
forming at least one venting hole in the lid, exposing the additional silicon material; and
venting the tungsten material, silicon material and additional silicon material above and below the MEMS beam structure to form the upper cavity and the lower cavity.

10. The method of claim 1, further comprising:
forming the lid over the tungsten material formed above the MEMS beam structure;
forming at least one vent hole in the lid and through the tungsten material formed above the MEMS beam structure to expose the semiconductor material formed above the MEMS beam structure; and
venting the semiconductor material formed above the MEMS beam structure while venting the tungsten material formed above the MEMS beam structure.

11. The method of claim 10, wherein the lid is formed with a planar surface on an underside thereof by depositing the lid directly on one of the tungsten material formed over the MEMS beam structure or another layer of semiconductor material formed on the tungsten material formed over the MEMS beam structure.

12. The method of claim 10, wherein the forming of the least one vent hole is forming at least two vent holes in the lid, wherein a first of the at least two vent holes exposes the semiconductor material above the MEMS beam structure and a second of the at least two vent holes exposes the tungsten material above the MEMS beam structure.

13. The method of claim 1, wherein the tungsten material above the MEMS beam structure is formed in seams formed in the semiconductor material above the MEMS beam beam, and the venting begins with the semiconductor material above the MEMS beam structure.

14. The method of claim 1, wherein the venting forms an undercut in at least one of the upper cavity and the lower cavity.

15. The method of claim 1, wherein the tungsten material at least one of above and below the MEMS beam structure is devoid of oxide.

16. A method of forming a Micro-Electro-Mechanical System (MEMS) beam, comprising:
forming a wiring layer on a substrate;
forming a first tungsten material over the substrate;
forming a first silicon material over the first tungsten material;
forming a MEMS beam over the first silicon material;
forming a via through the MEMS beam to expose the first silicon material;
forming a second silicon material above the MEMS beam and within the via to contact exposed portions of the first silicon material;
forming second tungsten material on the second silicon material;
forming a lid over the second tungsten material;
forming at least one vent hole in the lid, exposing a portion of the at least second silicon material;
venting the first and second tungsten material and the first and second silicon material by performing an $XeF_2$ etching process to form a lower cavity and an upper cavity about the MEMS beam, respectively; and
sealing the at least one vent hole.

17. The method of claim 16, further comprising forming the second tungsten material in seams formed in the second silicon material, and planarizing the second silicon material.

18. The method of claim 16, further comprising forming a third silicon material on the second tungsten material, and forming the lid directly on the third silicon material.

19. A method comprising forming a Micro-Electro-Mechanical System (MEMS) beam structure by:
- forming both tungsten material and semiconductor material on substrate;
- forming the MEMS beam structure above the tungsten material and the semiconductor material;
- forming both tungsten material and semiconductor material above the MEMS beam structure;
- forming a lid over the tungsten material and the semiconductor material formed above the MEMS beam structure, and
- etching both the tungsten material and the semiconductor material at least above and below the MEMS beam structure by performing an $XeF_2$ etching process to form an upper cavity structure below the lid and above the MEMS beam structure and a lower cavity structure below the MEMS beam structure and above the substrate.

* * * * *